(12) United States Patent
Drew et al.

(10) Patent No.: US 7,883,373 B2
(45) Date of Patent: Feb. 8, 2011

(54) PLUG COMPONENT FOR AN ELECTRICAL CONTROL UNIT

(75) Inventors: Gregory Drew, Regensburg (DE); Nikolaus Kerner, Wenzenbach (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 12/356,608

(22) Filed: Jan. 21, 2009

(65) Prior Publication Data

US 2009/0191743 A1 Jul. 30, 2009

(30) Foreign Application Priority Data

Jan. 17, 2008 (DE) ........................ 10 2008 004 831

(51) Int. Cl.
*H01R 13/648* (2006.01)
(52) U.S. Cl. ..................... 439/608; 439/589; 439/485; 439/620.12
(58) Field of Classification Search ................ 439/485, 439/559, 620.12, 608
See application file for complete search history.

(56) References Cited

U.S. PATENT DOCUMENTS

| | | | | |
|---|---|---|---|---|
| 4,810,208 A | * | 3/1989 | Hayes et al. | 439/589 |
| 5,266,054 A | * | 11/1993 | Duncan et al. | 439/620.12 |
| 5,621,328 A | * | 4/1997 | Yamanashi | 324/538 |
| 6,139,351 A | * | 10/2000 | Schaefer et al. | 439/372 |
| 6,293,232 B1 | * | 9/2001 | Allen | 123/73 C |
| 6,309,257 B1 | | 10/2001 | Huang | |
| 6,338,651 B1 | * | 1/2002 | Svette et al. | 439/559 |
| 6,343,953 B2 | * | 2/2002 | Nakamura et al. | 439/589 |
| 7,614,910 B2 | * | 11/2009 | Croteau et al. | 439/573 |

FOREIGN PATENT DOCUMENTS

| | | |
|---|---|---|
| DE | 201 11 325 U1 | 11/2002 |
| EP | 1 287 272 A1 | 1/2003 |

\* cited by examiner

*Primary Examiner*—Truc T Nguyen
(74) *Attorney, Agent, or Firm*—Laurence A. Greenberg; Werner H. Stemer; Ralph E. Locher

(57) ABSTRACT

A plug component for an electrical control unit has a contact section formed with one or more compartments, in which a number of contact pins extend perpendicular to a first reference plane. The plug component can be contacted mechanically and electrically with a plug via the contact section. An attachment section extends along the first reference plane and comprises a number of sealing sections, which are provided for resting against corresponding sealing sections of at least one housing component of the control unit. A first of the sealing sections runs in parallel to the first reference plane. Second sealing sections curve away from opposing free ends of the first sealing section and extend in a second reference plane which is arranged perpendicular to the first reference plane.

20 Claims, 3 Drawing Sheets

PLUG COMPONENT FOR AN ELECTRICAL CONTROL UNIT

CROSS-REFERENCE TO RELATED APPLICATION

This application claims the priority, under 35 U.S.C. §119, of German patent application DE 10 2008 004 831.3, filed Jan. 17, 2008; the prior application is herewith incorporated by reference in its entirety.

BACKGROUND OF THE INVENTION

Field of the Invention

The invention relates to a plug component for an electrical control unit.

Such a plug component usually comprises a contact section which includes one or more compartments in which a number of contact pins extend perpendicular to a first reference plane. The plug component is able to be contacted mechanically and electrically with a plug via the contact section. An attachment section which extends along the first reference plane and comprises a number of sealing sections, enables the unit to be placed on corresponding sealing sections of at least one housing component of the control device.

Such a plug component is connected electrically and as a rule mechanically to a circuit carrier with electronic components and conductor tracks accommodated thereon. The circuit carrier with the components located on it is arranged in a single-part or multi-part housing to protect it from environmental influences. The electronic components are sealed in this case by the sealing sections of the attachment section of the plug component and of the at least one housing component of the control unit which correspond to each other.

The number of contact pins provided in the plug component basically depends on the functionality of the control unit. Far more than 100 such contact pins are provided in an electrical control unit for use in motor vehicles, for example, an engine or transmission controller. The contact pins are arranged in the one or more compartments—depending on the control unit—in one or more rows. Each row is also referred to as a blade connector. The maximum number of contact pins able to be arranged in a plug connector depends on the size of the one or more compartments. The size of the one or more compartments in its turn depends on the dimensions of the control unit.

FIGS. 5 to 7 show a plug component known to the applicant, which illustrates the problem underlying the invention. FIG. 5 shows a side view of plug connector 1 which features a contact section 2 and an attachment section 3. FIG. 6 shows a cross-section along the line VI-VI in FIG. 5. The orientation in a Cartesian coordinate system may be taken from the figures in each case, based on the coordinates x, y, and z shown in the diagram. The contact section 2 comprises in this plug component 1 a single cup-shaped compartment 7 with an approximately rectangular cross-section (cf. the dashed line provided with the reference symbol 7 in FIG. 6). A number of contact pins 4, 5, 6 extend into the compartment 7 of the contact section 2. In the plug component 1 the pins are arranged in three rows above one another, with contact pins of the uppermost row being labeled with the reference numeral 4, contact pins of the middle row with the reference numeral 5, and contact pins of the lower row with the reference numeral 6. As already described above, the contact pins are contacted via a plug able to be connected to the plug component 1, i.e. the contact section 2. With their other free ends the contact pins 4, 5, 6 project beyond the attachment section 3 and are bent downwards by 90° for contacting with a circuit board (in the y-direction of the coordinate system).

In the area of the attachment section 3, which in cross-section (cf. FIG. 6) has an approximately bowl-shaped design, the plug component 1 is connected to a housing component of the control unit. The attachment section in the shape of a bowl and open at the top (in the y-direction) includes a sealing section 8 running in the x-direction and two sealing sections 9 and 10 extending in the y-direction. The sealing sections 9 and 10 are bent at an angle alpha1 in relation to the y-axis. If the plug component is assembled with the at least one housing component of the control unit, the sealing sections 8, 9 and 10 adjoin corresponding sealing sections of the at least one housing section, with a seal being established by a sealing material arranged between the two.

The reason for the inclination of the sealing sections 9, 10 to be seen in FIG. 6 by the angle alpha1 in relation to the sealing section 8 emerges from the way in which of the plug component 1 is installed with the housing component 11 of the control unit (cf. FIG. 7). The plug component 1 is pressed in the direction of the arrow into a cutout embodied to correspond to the attachment section 3 with sealing sections 18, 19 and 20, on which sealing material 21 is located. If the sealing sections 9, 10 and correspondingly the sealing sections 19 and 20 are arranged at right angles to the sealing section 8 or 18, on assembly of the plug component 1 with the housing component 11 the seal material 21 would more or less completely pull away from the sealing sections 19 and 20, so that after the complete joining of plug component 1 and housing component 11 there would be no sealing material 21 arranged in this area. By contrast an accumulation of sealing material would occur in the area of corners 22 of the housing component 11, so that the distance between the sealing section 8 and the sealing section 18 of the housing component 11 would under some circumstances be too great. Only through the angled design of the sealing sections 9, 10 or. 19, 20 can the desired retention of the sealing material 21 in these sections be ensured.

The angled arrangement of the sealing sections 9 and 10 relative to the sealing section 8 has consequences for the constructive embodiment of the plug component 1, as can best be seen from FIG. 6. The width $d_1$ of the compartment 7 (or of a plurality of neighboring compartments) is delimited by a width a of the sealing section 8. By contrast, the overall width b of the plug component 1 is defined by the width a of the sealing sections 8 plus twice the width c for the angled sealing sections 9 and 10. As a result of the construction, a width e of the housing component 11 of the control unit is in its turn greater than the width b of the plug component 1. The width e is this case is generally predetermined.

An increase in the number of the contact pins of the plug component is therefore not readily possible for such a plug component because of the immutability of the width $d_1$ of the compartment 7. The increase in the number of contact pins by a further row (blade connector) and/or a reduction of the distance between neighboring contact pins is expensive in manufacturing terms however and not always easily possible, since there may not be less than a minimum spacing between two adjacent contact pins.

SUMMARY OF THE INVENTION

It is accordingly an object of the invention to provide a plug component for an electric control unit which overcomes the above-mentioned disadvantages of the heretofore-known devices and methods of this general type and which provides for a plug component that allows an increase in the number of the contact pins and simultaneously a reliable seal to one or more housing components of the control unit.

With the foregoing and other objects in view there is provided, in accordance with the invention, a plug component for an electrical control unit, comprising:

a contact section formed with one or more compartments, a plurality of contact pins disposed in the one or more compartments and extend perpendicular to a first reference plane, the contact section enabling the plug component to be contacted mechanically and electrically with a plug;

an attachment section extending along the first reference plane and including a plurality of sealing sections configured for resting against corresponding sealing sections of a housing component of the control unit;

the sealing sections including:

a first sealing section extending parallel to the first reference plane, and having mutually opposite free ends; and one or more second sealing sections curving away from the free ends of the first sealing section and extending in a second reference plane perpendicular to the first reference plane or at a angle greater than 90° relative to the first reference plane.

In other words, the plug component according to the invention for an electrical control unit comprises a contact section and an attachment section. The contact section is formed with one or more compartments, in which a number of contact pins extend in each case perpendicular to a first reference plane, with the plug component able to be contacted mechanically and electrically via the contact section with a plug. The attachment section extends along the first reference plane and comprises a number of sealing sections, which are intended to rest against corresponding sealing sections of at least one housing component of the control unit. A first of the sealing sections runs in parallel to the first reference plane. Second of the sealing sections curve away from opposing free ends of the first sealing section and extend in a second reference plane or at an angle greater than 90° to the second reference plane which is arranged perpendicular to the first reference plane.

The invention thus makes possible a plug component in which the one compartment or the number of compartments can extend over the entire width of the plug component. As a result of the enlarged compartment it is possible to arrange an increased number of contact pins cost-effectively next to one another in the plug component. In addition the inventive plug component has the advantage that installation in respect of making a seal with one or more other housing components of the control unit can be undertaken in a simplified manner. In particular the inventive construction, in which the second sealing sections extend perpendicular to the second reference plane, allows the plug component to be made as wide as the housing component with which this is to be connected. In the case of a non-perpendicular arrangement of the second sealing sections relative to the second reference plane, the angle is between 135° and 90° for example.

In accordance with a first embodiment the first and the second sealing sections are embodied in the shape of webs. The seal is made so that, in contrast to the prior art, it is no longer across a flat surface but merely in a narrow web-shaped area, meaning that the plug component occupies a smaller space. By comparison with the prior art, this allows a control unit with smaller dimensions to be implemented.

The sealing principle of the inventive plug component is based in accordance with a further embodiment on the groove-spring principle, with the first and the second sealing sections optionally able to have a groove or a spring. The corresponding sealing sections of the housing component or components of the control unit are then embodied to complement each other.

A further embodiment variant makes provision for the second sealing sections to feature at least one sealing web running in the second reference plane and at an angle to the first reference plane. In addition to simplifying installation, this constructive feature enables the reliability of the sealing to be made easier as a result of the installation process. The angle of the sealing web is less than 90° and greater than 0° in relation to the first reference plane, preferably less than 85° and greater than 5°, preferably less than 75° and greater than 65° and mostly preferably 75°.

For reasons of cost and weight the plug component is expediently made from a plastic. This can for example be manufactured using an injection molding process.

The width of the first sealing section corresponds to the width of the control unit, with this in principle being able to be any width and in accordance with an expedient embodiment being between 80 mm and 230 mm, preferably between 120 mm and 180 mm and mostly preferably 180 mm.

The one or more compartments can be arranged distributed over the entire width of the first sealing section. The number of compartments can be selected in accordance with functional or mechanical considerations.

The contact pins can be arranged in a number of rows, especially in four or five rows. The inventive plug component however also allows the provision of just a single row of contact pins.

The contact pins can in principle be embodied as required. In accordance with an expedient embodiment these pins are embodied straight or angled. An angled embodiment of the contact pins is worthwhile if the bent ends of the contact pins are to be connected to the circuit carrier such that the plane of the circuit carrier corresponds to the orientation of the at least one compartment. The use of straight contact pins can be provided with straight circuit carriers for which one section is angled in relation to the remainder of the surface of the circuit carrier.

Other features which are considered as characteristic for the invention are set forth in the appended claims.

Although the invention is illustrated and described herein as embodied in a plug component for an electrical control unit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
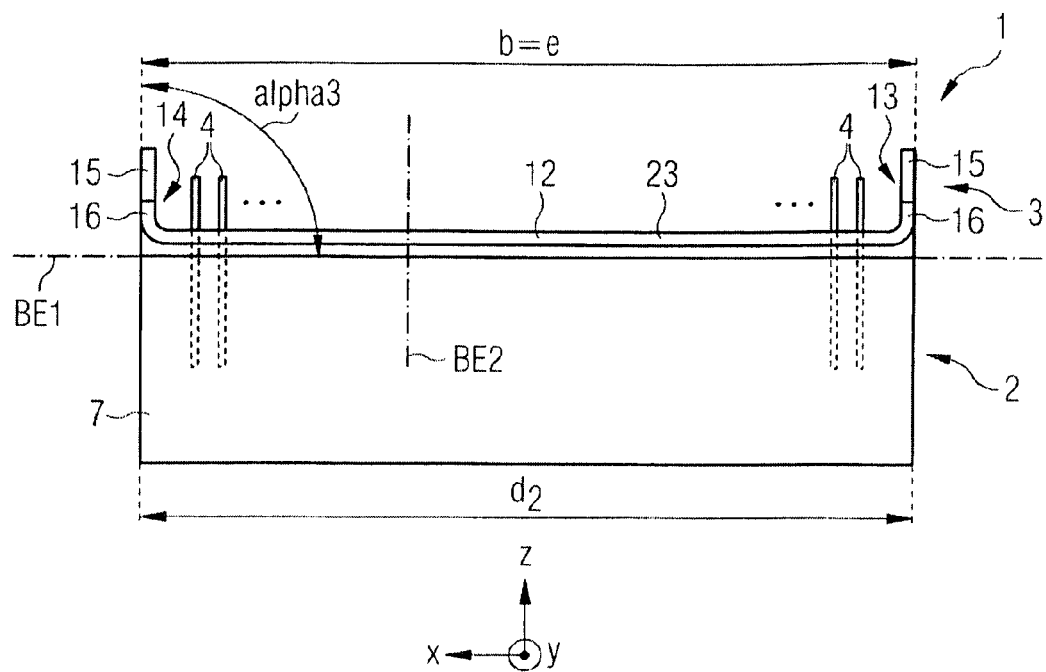
FIG. 1 is an overhead view of an embodiment of the plug component according to the invention.
Figure 2:
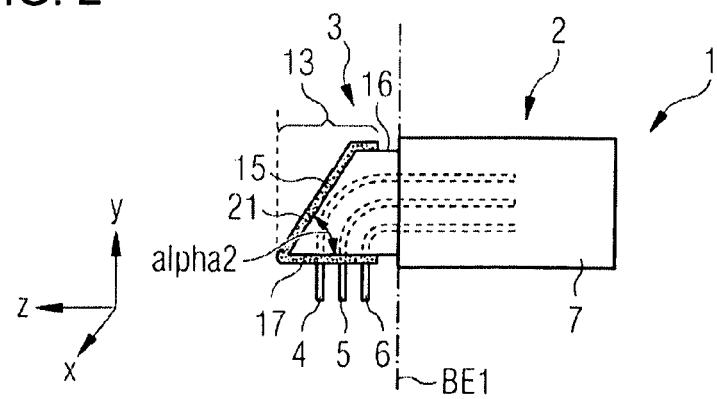
FIG. 2 is a side view of an inventive plug component.

Referring now once more to the figures of the drawing in detail, the apparatus according to the invention is illustrated in FIGS. 1 and 2 with the component 1 in an overhead view and a side view, respectively. A coordinate system (Cartesian x, y, z) is drawn in as well in addition to the diagrams of the control unit 1. The coordinate system is intended to illustrate the orientation of the first and second reference planes BE1 and BE2 described below in greater detail.

In accordance with a plug component as per the prior art an inventive component 1 comprises a contact section 2 as well as an attachment section 3. The contact section 2 comprises just a single compartment 7 in the example, into which free ends of the contact pins 4, 5 and 6 make possible external contacting with a plug embodied to complement the compartment 7. The contact pins 4, 5, 6 are arranged above one another in three rows (blade connectors), with a number of rows which differs from that shown in the drawings being possible in principle. The contact pins of the uppermost row are identified by the reference numeral 4, the contact pins of the middle row by the reference numeral 5 and the contact pins of the lowermost row by the reference numeral 6. All contact pins 4, 5, 6 extend in the compartment in parallel to one another and perpendicular to a first reference plane BE1, which corresponds to the x-y plane of the coordinate system.

The attachment section substantially comprises a first sealing section 12, which extends along, i.e. parallel to, the first reference plane BE1 and in this case runs via an entire width $d_2$ of the compartment 7. Second sealing sections 13 and 14 bend away at the free ends of the first sealing section 12. The second sealing sections 13 and 14 extend in a second reference plane BE2 which is arranged perpendicular to the first reference plane BE1. The second reference plane BE2 thus corresponds to the y-z plane of the coordinate system. In parallel to the second reference plane BE2 and perpendicular to the first reference plane BE1 the second ends of the contact pins 4, 5, 6 protrude into the attachment section 3 where they are able to be contacted with a circuit board not shown in the figures with electrical components arranged thereon.

The sealing sections 12, 13, 14 are embodied in the shape of webs, with a sealing web 23 of the sealing sections 12 extending over its entire length, i.e. the width $d_2$. The sealing web 23 is thus embodied straight, i.e. not spatially over the entire width $d_2$. By contrast the second sealing sections 13, 14 have a sealing web 15 which runs at an angle alpha2 to the first reference plane BE1, and sealing webs 16, 17, which (in the exemplary embodiment) run perpendicular to the first reference plane BE1. In relation to the first reference plane BE1 the angle alpha2 of the sealing web is less than 90° and greater than 0°, preferably less than 85° and greater than 5°, further preferably less than 75° and greater than 65° and mostly preferably 70°. The sealing webs 16 and 17 which run in the second reference plane and perpendicular to the first reference plane BE1 seal with the sealing web 15.

By contrast with the view of the attachment section 3 shown in FIG. 2, this can also feature two or more angled sealing webs 15. In particular the attachment section 3 (on each side) can have two angled sealing webs 15, so that an approximately symmetrical shape of the attachment section 3 is achieved.

The sealing webs 15, 16, 17 and 23 optionally feature a groove or a web, i.e., key and slot. Sealing sections of a housing component of the control unit to be joined are then embodied with complementary structures.

As can readily be seen from the overhead view depicted in FIG. 1, the design of the attachment section 3 enables the compartment 7 (width $d_2$) of the contact section 2 to be designed as wide as the plug component 1 (width b), with the width b corresponding to the width e of the control unit. This can especially be seen from the perspective view shown in FIG. 3, in which an inventive plug component 1 with housing components 101 and 102 are assembled into a control unit 100. Simply as an example, the plug component 1 shown here features two compartments 7, in which a number of contact pins 6 (the lowest of a number of rows) can also be seen. It can also easily be seen from FIG. 3 that the housing component 101 represents a cover which adjoins the seal sections 12, 13 and 14 and thereby the sealing webs 15, 16, 17 and 23. Although the compartments 7 do not extend over the entire width of the plug component 1, as is shown in the exemplary embodiment of FIG. 1, this is possible in principle.

Figure 3:
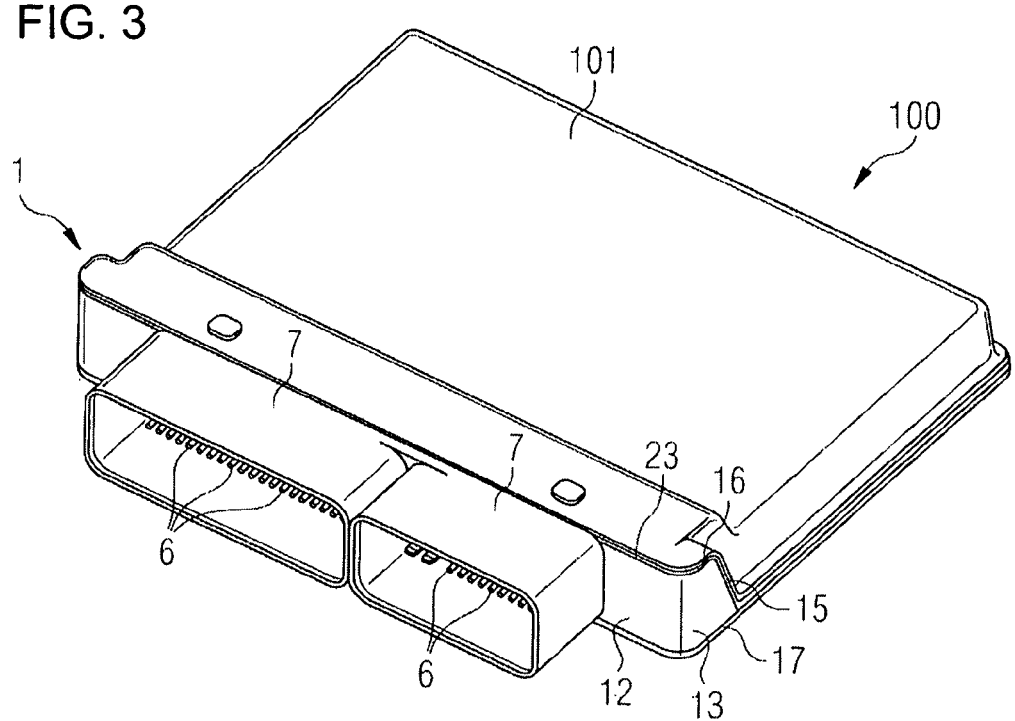
FIG. 3 is a perspective view of a control unit with an plug component according to the invention.
Figure 4:
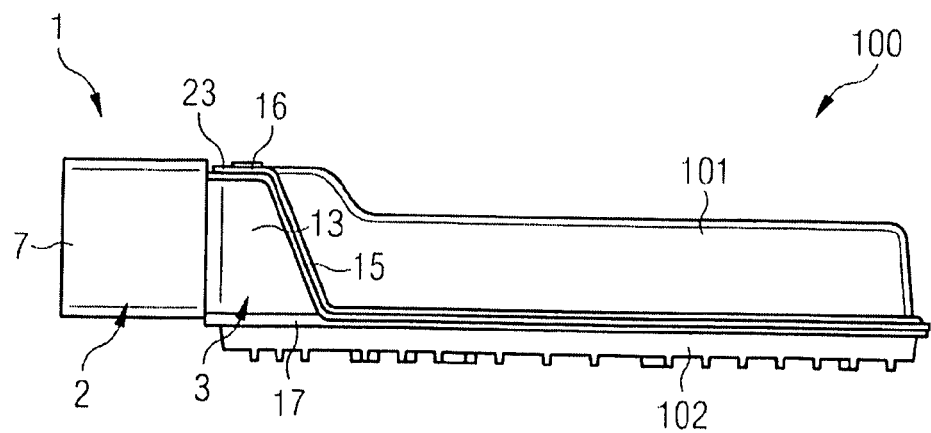
FIG. 4 is a side view of the control unit of FIG. 3.
Figure 5:
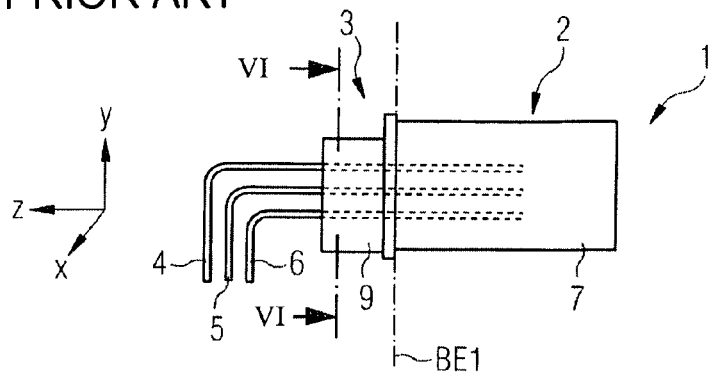
FIG. 5 is a side view of a prior art plug component.
Figure 6:
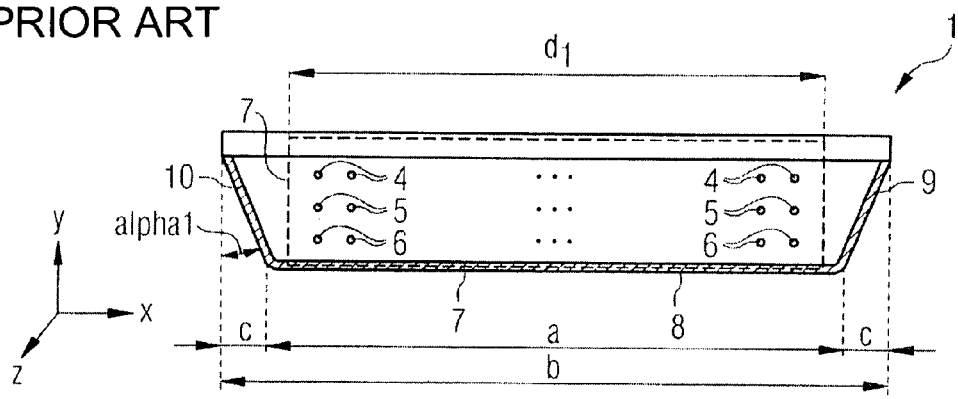
FIG. 6 is a cross-section taken along the line VI-VI in FIG. 5.
Figure 7:
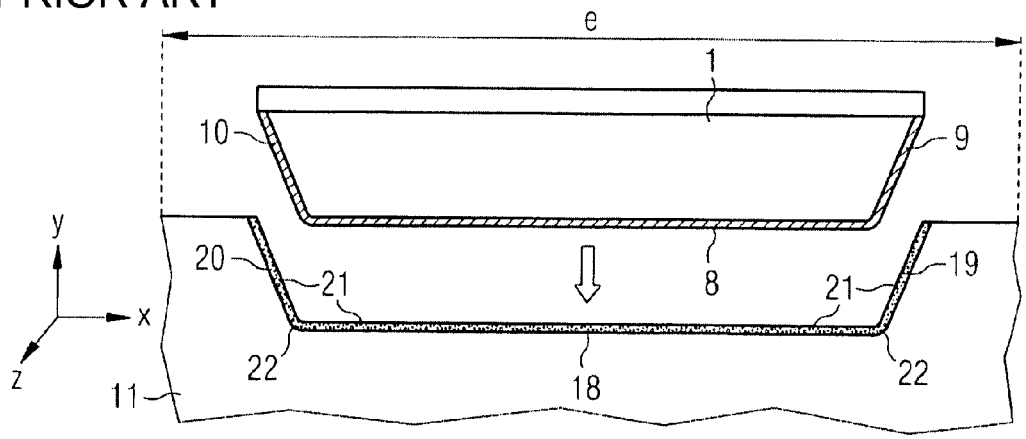
FIG. 7 a schematic diagram of a production step for assembling the plug component of FIG. 5 and FIG. 6 with a housing component of the control unit.

FIG. 4 shows a side view of the control unit 100 shown in FIG. 3. This view shows very well that the cover 101 clings to the sealing webs 15, 16, 23 and the housing component 102 to the sealing web 17 and a sealing web above the sealing webs 23 on the underside of the sealing section 12.

A thixotropic sealing material is expediently used as the sealing material which can be applied in a simple manner to the three-dimensional shape of the sealing webs of the attachment section 3. The use of a thixotropic sealing material further simplifies manufacturing, since there is no running or flowing of the sealing material without the application of an external force. This allows the control unit to be manufactured in a shorter time and manufacturing to be simplified.

The inventive plug component is based on the consideration of modifying the angled sealing sections such that these stand in a plane perpendicular to the first reference plane. This allows the entire width of the plug component to be accepted by the contact section. This enables the number of contact pins to be increased in a simple manner without increasing the width of the control unit.

The advantages of this are as follows: With the exception of the width of the sealing webs of the second sealing sections the entire width can be used for contact pins. In a standard housing used currently the width amounts to 180 mm. In the plug component according to the invention, this enables a width of 170 mm to be used for the contact pins.

The number of contact pins principally depends on the selected width (and height) of the first sealing section. With a width of, say, 180 mm the number is 154 for a prior art plug component. The invention allows a number of almost 200 contact pins for this width.

Nor do any changes in the sequence of manufacturing of the control unit need to be made.

The use of existing connection interfaces is also possible, with only a rearrangement of connection combinations being required. For example a currently used combination of 154 contact pins can be reorganized into a combination of 192 contact pins. This allows the continued use of known interface arrangements.

The increase in the number of contact pins can further be implemented without the addition of a further row of contact pins, which allows the complexity, especially with curved contact pins to be reduced within the framework of manufacturing.

The invention claimed is:
1. A plug component for an electrical control unit, comprising:

a contact section formed with one or more compartments, a plurality of contact pins disposed in said one or more compartments and extend perpendicular to a first reference plane, said contact section enabling the plug component to be contacted mechanically and electrically with a plug;

an attachment section extending along the first reference plane and including a plurality of sealing sections configured for resting against corresponding sealing sections of a housing component of the control unit;

said sealing sections including:

a first sealing section extending parallel to the first reference plane, and having mutually opposite free ends; and one or more second sealing sections curving away from said free ends of said first sealing section and extending in a second reference plane perpendicular to the first reference plane or at a angle greater than 90° relative to the first reference plane;

said second sealing sections including at least one sealing web extending in the second reference plane and enclosing a given angle with the first reference plane.

2. The plug component according to claim 1, wherein said first sealing section is formed as a web.

3. The plug component according to claim 1, wherein said first and second sealing sections are formed with a groove.

4. The plug component according to claim 1, wherein said first and second sealing sections are formed with a key.

5. The plug component according to claim 1, wherein the given angle of said sealing web relative to the second reference plane is less than 90° and greater than 0°.

6. The plug component according to claim 1, wherein the given angle of said sealing web relative to the first reference plane lies between 85° and 5°.

7. The plug component according to claim 1, wherein the given angle of said sealing web relative to the first reference plane lies between 75° and 65°.

8. The plug component according to claim 1, wherein the given angle of said sealing web relative to the first reference plane is approximately 70°.

9. The plug component according to claim 1, formed of plastic material.

10. The plug component according to claim 1, wherein a width of said first sealing section corresponds to a width of the control unit.

11. The plug component according to claim 10, wherein the width of the control unit lies between 80 mm and 230 mm.

12. The plug component according to claim 11, wherein the width of the control unit lies between 120 mm and 180 mm.

13. The plug component according to claim 11, wherein the width of the control unit is approximately 180 mm.

14. The plug component according to claim 1, wherein said one or more compartments are arranged distributed over an entire width of said first sealing section.

15. The plug component according to claim 1, wherein said contact pins are arranged in a plurality of rows.

16. The plug component according to claim 15, wherein said contact pins are arranged in four rows.

17. The plug component according to claim 15, wherein said contact pins are arranged in five rows.

18. The plug component according to claim 15, wherein said contact pins are straight contact pins.

19. The plug component according to claim 15, wherein said contact pins are curved contact pins.

20. The plug component according to claim 1, in combination with the housing component, further comprising a sealing material disposed between the sealing sections of the housing component and said plurality of sealing sections of the plug component.

* * * * *